(12) United States Patent
Nedovic et al.

(10) Patent No.: US 6,646,487 B2
(45) Date of Patent: Nov. 11, 2003

(54) METHOD AND SYSTEM FOR REDUCING HAZARDS IN A FLIP-FLOP

(75) Inventors: Nikola Nedovic, San Jose, CA (US); Vojin G. Oklobdžija, Berkely, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/044,458

(22) Filed: Jan. 11, 2002

(65) Prior Publication Data

US 2003/0062940 A1 Apr. 3, 2003

Related U.S. Application Data

(60) Provisional application No. 60/323,198, filed on Sep. 17, 2001.

(51) Int. Cl.[7] .............................................. H03K 3/356
(52) U.S. Cl. .................. 327/211; 327/212; 327/218
(58) Field of Search .................................. 327/200, 201, 327/211, 212, 219, 208, 210, 214, 199, 218

(56) References Cited

U.S. PATENT DOCUMENTS

| | | | |
|---|---|---|---|
| 5,764,089 A | | 6/1998 | Partovi et al. |
| 5,774,005 A | * | 6/1998 | Partovi et al. ............... 327/203 |
| 5,898,330 A | | 4/1999 | Klass |
| 5,900,759 A | * | 5/1999 | Tam ........................... 327/211 |
| 5,917,355 A | | 6/1999 | Klass |
| 5,990,717 A | | 11/1999 | Partovi et al. |
| 6,087,872 A | | 7/2000 | Partovi et al. |
| 6,304,123 B1 | * | 10/2001 | Bosshart ...................... 327/212 |

OTHER PUBLICATIONS

F. Klass, "Semi–Dynamic and Dynamic Flip–Flops with Embedded Logic", Symp. on VLSI Circ. Digest of Technical Papers, Jun. 1998.

H. Partovi, et al., "Flow–Through Latch and Edge–Triggered Flip–Flop Hybrid Elements", ISSCC Digest of Technical Papers, pp. 138–139, Feb. 1996.

V. Stojanovic, V.G. Oklobdzija, "Comparative Analysis of Master–Slave Latches and Flip–Flops for High–Performance and Low–Power Systems", IEEE Journal of Solid-State Circuits, vol. 34, No. 4, pp. 536–548, Apr. 1999.

N. Nedovic, V.G. Oklobdzija, "Dynamic Flip–Flop with Improved Power", Proceedings of International Conference of Computer Design, pp. 323–236, 2000.

J. Yuan, C. Stevenson, "High–Speed CMOS Circuit Technique", IEEE Journal of Solid–State Circuits, vol. 24 (No. 1), pp. 62–70, Feb. 1999.

* cited by examiner

*Primary Examiner*—Toan Tran
(74) *Attorney, Agent, or Firm*—Sheppard Mullin Richter & Hampton LLP

(57) ABSTRACT

The invention relates generally to the field of electronic circuit design, and in particular to techniques for reducing hazards in a digital logic circuit, for example, a digital logic flip-flop circuit. In an embodiment of the present invention a method for reducing hazards in a flip-flop, including, a pre-charged stage coupled to an evaluation stage by at least an internal node, is provided. First, the pre-charged stage sets the internal node based on a data input. The evaluation stage is prevented from evaluating the internal node for a predetermined time period. After the predetermined time period, the internal node is evaluated by the evaluation stage to determine an output of the flip-flop.

35 Claims, 12 Drawing Sheets

METHOD AND SYSTEM FOR REDUCING HAZARDS IN A FLIP-FLOP

CROSS REFERENCES

This application claims priority from and incorporates by reference in its entirety U.S. Provisional Application Serial No. 60/323,198, titled "A Method And System For Reducing Hazards In A Flip-Flop" by Nikola Nedovic, et. al., filed Sep. 17, 2001.

FIELD OF THE INVENTION

The invention relates generally to the field of electronic circuit design, and in particular to techniques for reducing hazards in a digital logic circuit, for example, a digital logic flip-flop circuit.

BACKGROUND OF THE INVENTION

The Semi-Dynamic Flip-Flop (SDFF) is one of the high performance flip-flops based on the hybrid concept. In part due to its size, low clock-to-output delay, negative set-up time, and simple topology, it is considered to be one of the fastest flip-flops today. However, the SDFF is susceptible to a hazard condition, when both the input and output are at a high logic value.

FIG. 1 shows a schematic circuit diagram of a typical prior art SDFF. The data input is D 312, the clock signal is CLK0 314, and the outputs are Q 316 and Qbar 317. The two inverters inv5 318 and inv6 319 are a "keeper" circuit which maintains the value of output Qbar 317 and hence output Q 316. A transparency window for the SDFF is given by the propagation delay of the two inverters, inv1 350 and inv2 352, and the NAND gate 354. The internal node X 320 of the first stage 330 of the SDFF is set to a high logic level (H), when the clock CLK0 314 is at a low logic level (L), i.e., the first stage 330 is pre-charged. When the input signal D 312 is H, node X 320 transitions from H to L in the transparency window where both CLK0 314 and S 356 are H (transistors Mn1 346, Mn2 344, and Mn3 342 are on). The second stage 332 captures the transition on node X 320 generated by the first stage 330 and produces output Q 316. In this case node X 320 sets output Q 316 to H via transistor Mp2 374. If input D 312 is L, Mn2 344 is off and node X 320 remains high during the transparency window. With node X 320 at H, output Q 316 is set at L during the transparency window (transistors Mn4 370 and Mn5 372 are on).

FIG. 2 is an example timing diagram for the SDFF schematic circuit diagram of FIG. 1 showing a glitch in the output. The timing diagram shows the clock signal CLK0 410 representing the CLK0 314 in FIG. 1. D 414, X 416, and Q 418 show the signals for D 312, node X 320, and Q 316 in FIG. 1 respectively. From FIG. 2, after the rising edge 430 of CLK0 410 and with D 414 set to L, X 416 remains at H and output Q 418, due to transistors Mn4 370 and Mn5 372, transitions from H to L 434. After another rising edge 440 of CLK0 410 and with D 414 at H, X 416 transitions from H to L 442 due to transistors Mn1 346, Mn2 344, and Mn3 342 turning on. Next output Q 418 transitions from L to H 444 due to transistor Mp2 374. Thus the L to H transition of output Q, e.g., 444, is done using in effect an inverting intermediate node X 320, while the transition of output Q, e.g., 434, from H to L is done directly via nMOS transistors and avoids the slower pMOS transistors. The SDFF is used where the time critical output transitions are from L to H, e.g., 444, on output Q 316, and thus the node X transition, e.g., H to L 442, is important.

However, the asymmetrical transition times of the SDFF lead to a "static-one-hazard" at the output Q when both input D and output Q are H. In FIG. 2, before the rising edge 450 of the CLK0 410, X 416 is set (or reset) to H by transistor Mp1 340. Because the first stage 330 has a non-zero propagation delay from the time of the rising clock edge 450 to the time X 416 transitions from H to L 454, the second stage 332 uses the previous X (H). Hence during the time window between the rising edge 450 of the clock CLK0 410 and the falling edge 454 of X 416, both Mn4 370 and Mn5 372 in FIG. 1 are on and the output Q 316 is pulled to low logic level (e.g., transition 452). After the propagation delay, i.e., the falling transition 454 of X 416, the transistor Mp2 372 turns on (and Mn4 370 turns off), and the output Q 316 is pulled to H (e.g., transition 456). Thus a glitch 462 is caused on the output Q 418 (and Qbar 420) and makes the use of the SDFF hazardous. In addition the glitch consumes power unnecessarily, as output Q 316 should not change, since input D 312 has not changed.

There is also a problem of power consumption in the unconditional keepers of the SDFF (back-to-back inverters, inv3 360 and inv4 362, and back-to-back inverters, inv5 318 and inv6 319, of FIG. 1). The keeper is used to hold the value of a dynamic node, e.g., node X 320 or output Q 316, that would otherwise be in high impedance and thus sensitive to leakage current effects and noise, especially in low-power applications where clock gating techniques are typically employed. The problem is that in order to change the value of the dynamic node, the keeper (two keepers, in the case of the SDFF) has to be overpowered, i.e., the output logic level of the keeper needs to be switched, which increases power consumption.

The power consumption and hazard problems associated with the SDFF, are demonstrative of the same or similar problems with hybrid-type flip-flops in general. Another example of a flip-flop having the same or similar type problems is the Hybrid Latch Flip-Flop (HLFF).

Therefore with the problems of hazard and power consumption with the conventional hybrid-type flip-flop, e.g., SDFF, there is a need for an improved flip-flop with fewer problems, such as fewer hazards or no hazards at all.

SUMMARY OF THE INVENTION

The present invention provides techniques, including a system and method, for reducing hazards in a conventional flip-flop, having a pre-charged stage coupled to an evaluation stage, by allowing a change in the pre-charged stage to settle before the evaluation stage processes the change. One embodiment has a substantially similar delay as the SDFF with fewer hazards and a significant reduction in power consumption.

Broadly, the present invention provides a method that reduces hazards in a flip-flop. In one embodiment this method includes a delayed reset of the output Q. The setting of the output Q, i.e., the second or evaluation stage, is disabled from being set to a low logic level by a delayed clock signal. This leaves time for the internal node X, i.e., output of the first or pre-charged stage, to transition from the high to the low logic level after the rising edge of the clock, without affecting the output Q. Consequently, the glitch that appears at Q in case of SDFF, when both the input D and output Q are at a high logic level, is prevented. In addition, a delayed pre-charge of the first stage is provided in order to prevent another hazard on the output Q. This hazard may occur because the second stage remains enabled until the delayed clock is pulled low. Hence, if the internal node X quickly charges before the second stage is disabled, a glitch on or false switching of output Q may occur. Thus, this embodiment provides a reduced-hazard flip-flop.

In another aspect of the present invention a method is provided for reducing hazards in a flip-flop, with the method including a pre-charged stage coupled to an evaluation stage by at least an internal node. First, the pre-charged stage sets the internal node based on a data input. The evaluation stage is prevented from evaluating the internal node for a predetermined time period. After the predetermined time period, the internal node is evaluated by the evaluation stage to determine an output of the flip-flop.

Yet another aspect of the present invention provides a system for reducing hazards in a hybrid flip-flop including: a pre-charge stage for determining a pre-charge stage output depending upon a data input during a transparency window; and an evaluation stage for evaluating the pre-charge stage output to produce a data output during the transparency window, where the evaluation stage is enabled to change the data output to a low logic level only after the pre-charge stage determines the pre-charge stage output. The transparency window includes a time period when the pre-charge stage output is logically equivalent to an inverted value of the data input. Optionally, after the transparency window, the pre-charge stage output is restored to a default logic level, when the evaluation stage is next disabled.

The present invention also includes a system for reducing hazards in a hybrid flip-flop. The system includes a pre-charge stage for determining a pre-charge stage output depending upon a data input during a transparency window; and an evaluation stage for evaluating the pre-charge stage output to produce a data output during the transparency window, where the evaluation stage is enabled to change the data output after the pre-charge stage determines the pre-charge stage output.

A further aspect of the present invention provides a method for reducing hazards in a flip-flop, including, a pre-charged stage coupled to an evaluation stage by at least an internal node. First the method determines a first logic level for the internal node based on a data input to the pre-charged stage within a first section of a transparency window. The evaluation stage is disabled from setting a data output to a second logic level during the first section of the transparency window. Next the data output is determined during a second section of the transparency window based on the first logic level, where the second section follows the first section.

Another embodiment of the present invention provides a method for reducing power consumption in a hybrid flip-flop, including a pre-charged stage coupled to an evaluation stage by at least an internal node. First, an input of the pre-charged stage is set to a high logic level. The output of the evaluation stage also has a high logic level. Responsive to the setting of the input, the internal node is set to a low logic level within a beginning part of a transparency window. The evaluation stage is disabled from setting the output to a low logic level, during the beginning part of the transparency window. And the evaluation stage maintains the high logic level on the output during a remainder of the transparency window, using the low logic level of the internal node.

A further embodiment of the present invention provides a system for reducing hazards in a hybrid flip-flop including: a pre-charge stage for determining a pre-charge stage output depending upon a data input during a first part of a transparency window. The pre-charge stage includes a first conditional keeper for keeping the pre-charge stage output. And an evaluation stage for evaluating the pre-charge stage output to produce a data output during a second part of the transparency window, where the evaluation stage includes a second conditional keeper for keeping the data output.

These and other embodiments, features, aspects and advantages of the invention will become better understood with regard to the following description, appended claims and accompanying drawings.

BRIEF DESCRIPTION OF THE DRAWINGS

FIGS. 12-1, 12-2, 12-3 and 12-4 show examples of the second stages of two flip-flops being combined.

DETAILED DESCRIPTION OF THE INVENTION

In the following description, numerous specific details are set forth to provide a more thorough description of the specific embodiments of the invention. It is apparent, however, to one skilled in the art, that the invention may be practiced without all the specific details given below. In other instances, well known features have not been described in detail so as not to obscure the invention.

Figure 3:
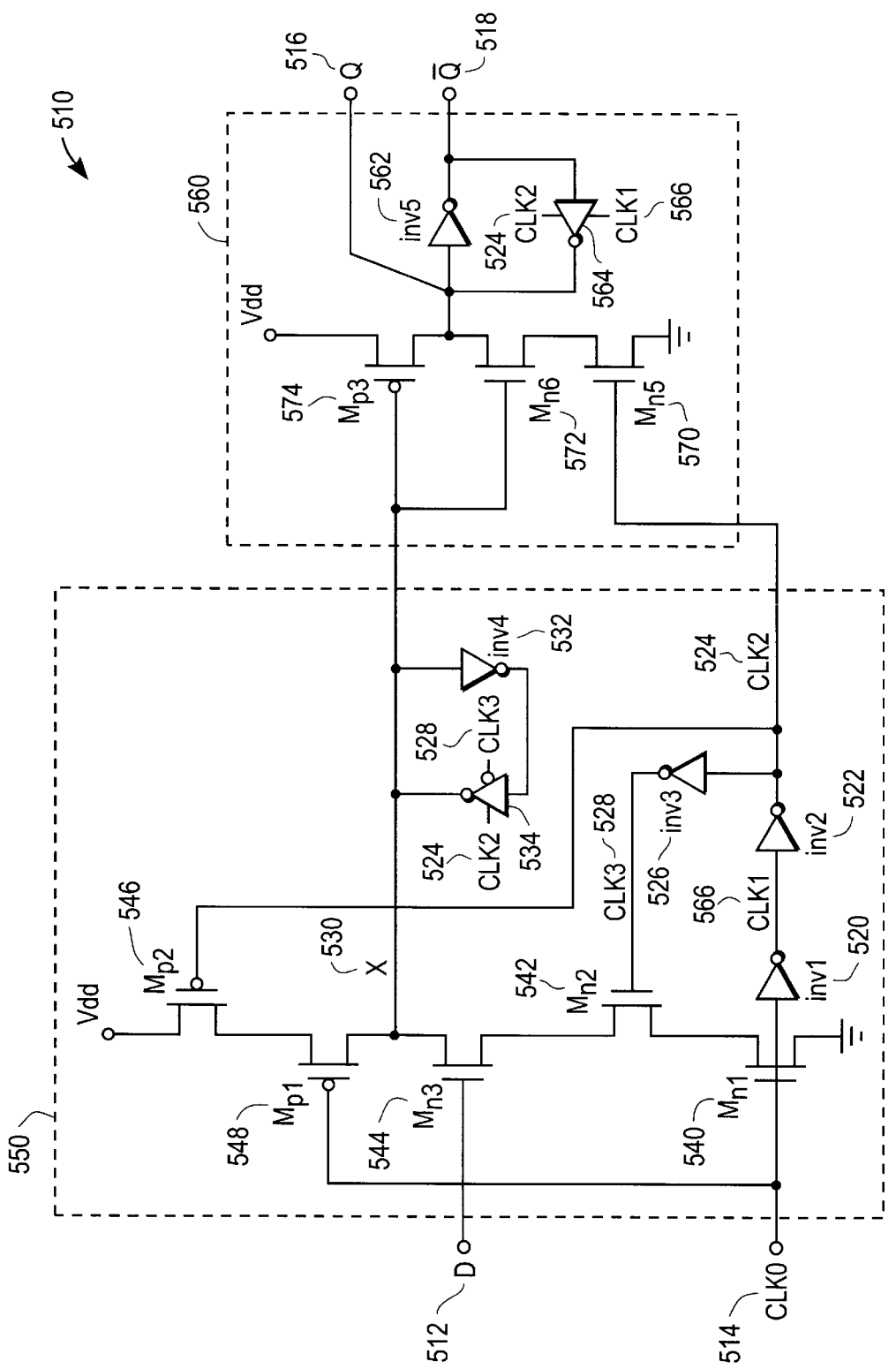
FIG. 3 illustrates a simplified circuit diagram of a flip-flop of a first embodiment of the present invention.

FIG. 3 illustrates a simplified circuit diagram of a flip-flop of one embodiment of the present invention. The D-type flip-flop 510 shown has input D 512, clock CLK0 514, and output Q 516 (inverted output Qbar 518). Clock CLK1 566 is the clock CLK0 514 delayed by the inverter inv1 520. Clock CLK2 524 is the clock CLK0 514 delayed by the inverters inv1 520 and inv2 522. Clock CLK3 528 is the clock CLK0 514 delayed by the three inverters inv1 520, inv2 522, and inv3 526. There is an internal node X 530 which connects the first or a pre-charge stage 550 to the second or evaluation stage 560. In addition, the clock CLK2 524 is also input into the second stage 560.

There are two conditional keepers that in general maintain the value of the outputs of the first and second stages mostly outside of the transparency window, where the transparency window includes the delay of the three inverters inv1 520, inv2 522, and inv3 526. The first conditional keeper maintains output Q 516 (and Qbar 518) and includes inverter inv5 562 connected to the inverted tri-state 564. The inverted tri-state 564 has outputs: high logic level (H), low logic level (L), and open circuit, i.e., high impedance (Z). The inverted tri-state 564 is conducting when both the clock CLK1 566 is H and the clock CLK2 524 is L. The inverted tri-state 564 is open or high impedance (Z), when either CLK1 566 is L or CLK2 524 is H. The second conditional keeper maintains node X 530 and includes inverter inv4 532 connected to the inverted tri-state 534. The inverted tri-state 534 is conducting when both the clock CLK2 524 is H and the clock CLK3 528 is L. The inverted tri-state 534 is open or high impedance (Z), when either CLK2 524 is L or CLK3 528 is H.

The basic operation of FIG. 3 is explained as follows: when CLK0 514 goes H, CLK2 524 disables the ability to set the output Q 516 of the evaluation or second stage (via transistor Mn5 570) from being set L for a predetermined time period, e.g., the delay of the two inverters inv1 520 and inv2 522, so that the output of the pre-charge or first stage 550, i.e., node X 530, can be set. Then after node X 530 is set, output Q 516 is set. This prevents the glitch 462 of the SDFF illustrated in FIG. 2 from occurring. In addition, CLK2 524 via transistor Mp2 546 delays the pre-charging of node X 530 to its default H value, until after the evaluation stage 560 is disabled from being set L. This prevents the fast charging of node X 530, when the CLK0 514 goes L, from affecting the output Q 516.

Figure 4:
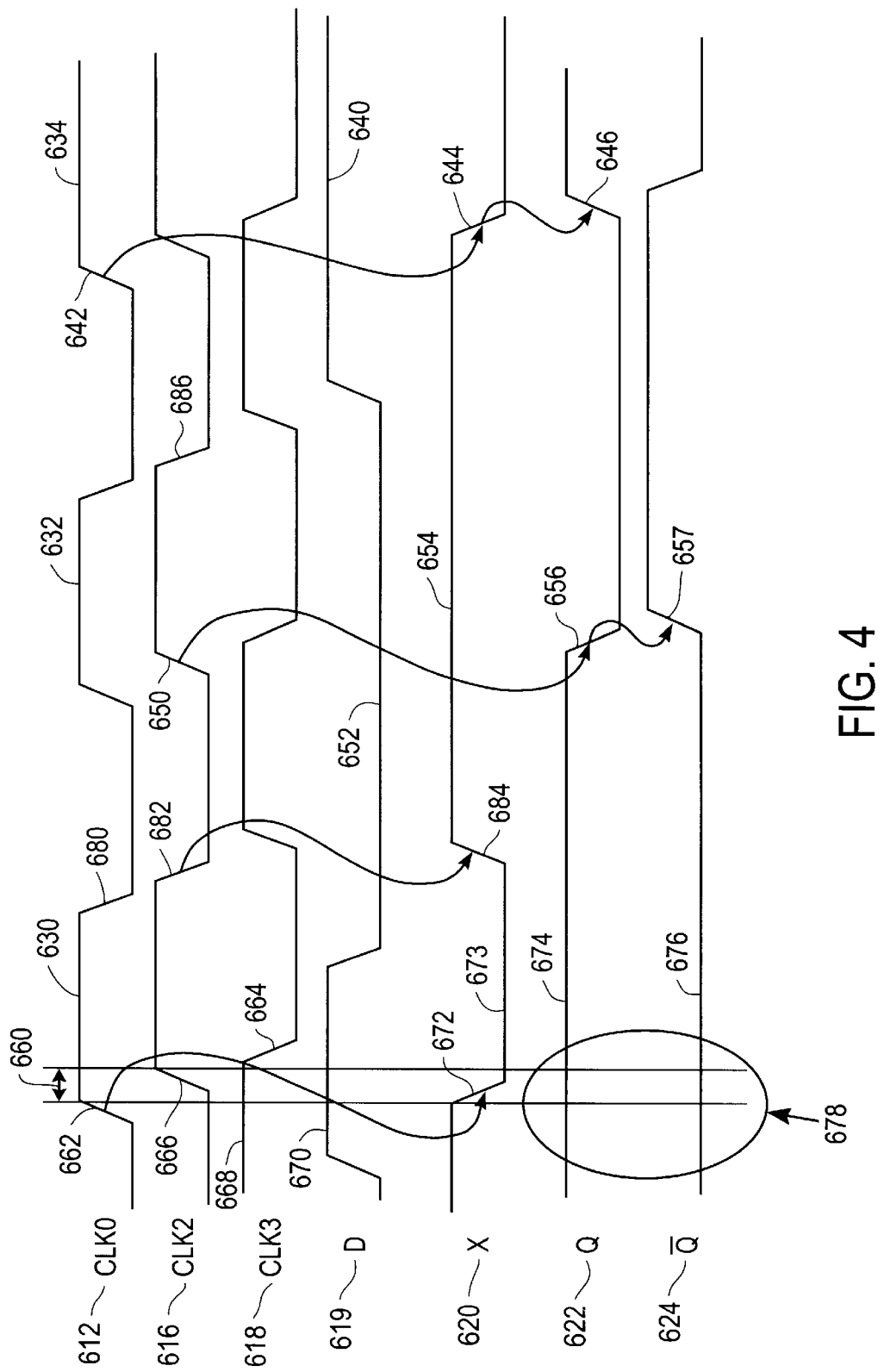
FIG. 4 shows an example of a simplified timing diagram for the embodiment of FIG. 3.

FIG. 4 shows an example of a simplified timing diagram for the embodiment of FIG. 3. The signals shown in FIG. 4, i.e., clock CLK0 612, clock CLK2 616, clock CLK3 618, input D 619, X 620, output Q 622, and output Qbar 624, correspond respectively to clock CLK0 514, clock CLK2 524, CLK3 528, input D 512, node X 530, output Q 516, and output Qbar 518 in FIG. 3. For illustration purposes only, there are three clock CLK0 612 cycles shown, cycle 630, cycle 632, and cycle 634. An example of a transparency window is the time interval from the rising edge 662 of clock CLK0 612 to the falling edge 664 of clock CLK3 618, i.e., both CLK0 612 and CLK3 618 are H. An example of a disable window 660 is shown for the time period from after the clock CLK0 612 rising edge 662 to after the rising edge 666 of clock CLK2 616. During this disable window the evaluation stage 560 is disabled from having its output set to L. X 620 needs to transition from its default (H) to L, e.g. transition 672, in this disable window. In other embodiments the disable window may be from before, during or after the rising edge 662 of clock CLK0 612 to before, during or after the rising edge 666 of clock CLK2 616. The main criteria for setting the disable window is that X 620 and CLK2 616 are not both simultaneously at a high logic level (H) in this disable time period. Otherwise, Mn5 570 and Mn6 572 may both be on, pulling output Q 516 to L and potentially causing a glitch on the output Q 516 like the SDFF circuit.

In FIG. 4 cycles 632 and 634 show the operation of the D type flip-flop 510 in changing the output Q 622 from H to L 656 and from L to H 646. The rising edge 642 of cycle 634 of clock CLK0 612, when D 619 is H 640, causes transistor Mn1 540 to turn on and transition X 620 from H to L 644 via transistors Mn1 540, Mn2 542, and Mn3 544. Next output Q 622 is pulled to H (transition 646) by transistor Mp3 574. The rising edge 650 in cycle 632 of clock CLK2 616, when D 619 is L 652, maintains H 654 on X 620, and causes transistor Mn5 570 to pull output Q 622 to L (transition 656). Thus like the H to L transition 434 of output Q 418 (FIG. 2) of the SDFF, the H to L transition 656 of the output Q 622 of this embodiment is done directly, i.e., does not involve a transition of X 620.

For cycle 630 of clock CLK0 612 the rising edge 662 causes transistor Mn1 540 to turn on. When the input D 619 is H 670, node X 620 is pulled to L via transistors Mn1 540, Mn2 542, and Mn3 544, e.g., transition 672. This H to L transition 672 is fast and is within the disable period 660. Next, the L to H transition 666 of clock CLK2 616 turns Mn5 570 on and since X 620 is L, Q 622 is set to H via transistor Mp3 574. As Q 622 is already H 674, no change on Q occurs. Thus there is no glitch on output Q 622 (or Qbar 624) in the area 678.

Referring to FIG. 3 and FIG. 4, the node X conditional keeper, i.e., inverter inv4 532 and inverted tri-state 534, maintains the node X 530 logic value (H or L). For example in FIG. 4, the falling edge 664 on CLK3 618 turns the inverted tri-state 534 on (CLK2 616 is H at falling edge 664), and hence the node X conditional keeper is turned on. Before the falling edge 664 the inverted tri-state 534 and thus the node X conditional keeper is an open circuit or off. Thus a change in X 620, for example, transition H to L 672, can occur within the transparency window without consuming the power necessary to change the state of a conventional keeper, i.e., fighting the keeper.

The output Q conditional keeper, i.e., inverter inv5 562 and inverted tri-state 564, maintains the output Q 516 and Qbar 518. For example, in FIG. 4, the falling edge (not shown) on CLK1 is one inverter delay after the rising edge 662 on CLK0 612. This falling edge turns the inverted tri-state 534 off, and hence the output Q conditional keeper is turned off. Thus the output Q conditional keeper is off during about the second half of the disable window 660 and the remainder of the transparency window. Therefore the output Q 516 may be set without consuming the power necessary to change the state of a conventional keeper.

Generally with some overlap in the transition window, the node X conditional keeper and the output Q conditional keeper alternate, with one being on while the other is off (i.e., open circuit). When the node X conditional keeper is on, CLK2 616 is H, and Mn5 570 is on. The transistors Mn6 572 and Mp3 574 then function as an inverter, passing an inverted node X to output Q 516. Hence the node X conditional keeper maintains the output Q 516. Thus one of the conditional keepers maintains the output Q outside of the transparency window.

Another feature of the embodiment of FIG. 3 is the delayed pre-charge of node X 530. This prevents another hazard on the output Q 516, when node X 530 transitions from L to H, i.e., node X 530 is pre-charged. For example, when CLK0 612 transitions from H to L (transition 680), transistor Mp1 548 is turned on. If Mp1 548 was directly connected to node X 530 (no intervening transistor Mp2 546), node X 530 could pre-charge to H before CLK2 524 turns off transistor Mn5 570. If output Q 516 is at H, then node X 530 via path Mn6 572 and Mn5 570, could cause a false switching or glitch (i.e., an unwanted voltage or current spike of short duration, usually unintentionally produced) on output Q 516. Transistor Mp2 546 controlled by clock CLK2 524 insures that transistor Mn5 570 is turned off before node X 530 is pre-charged by transistor Mp1 548.

Figure 5:
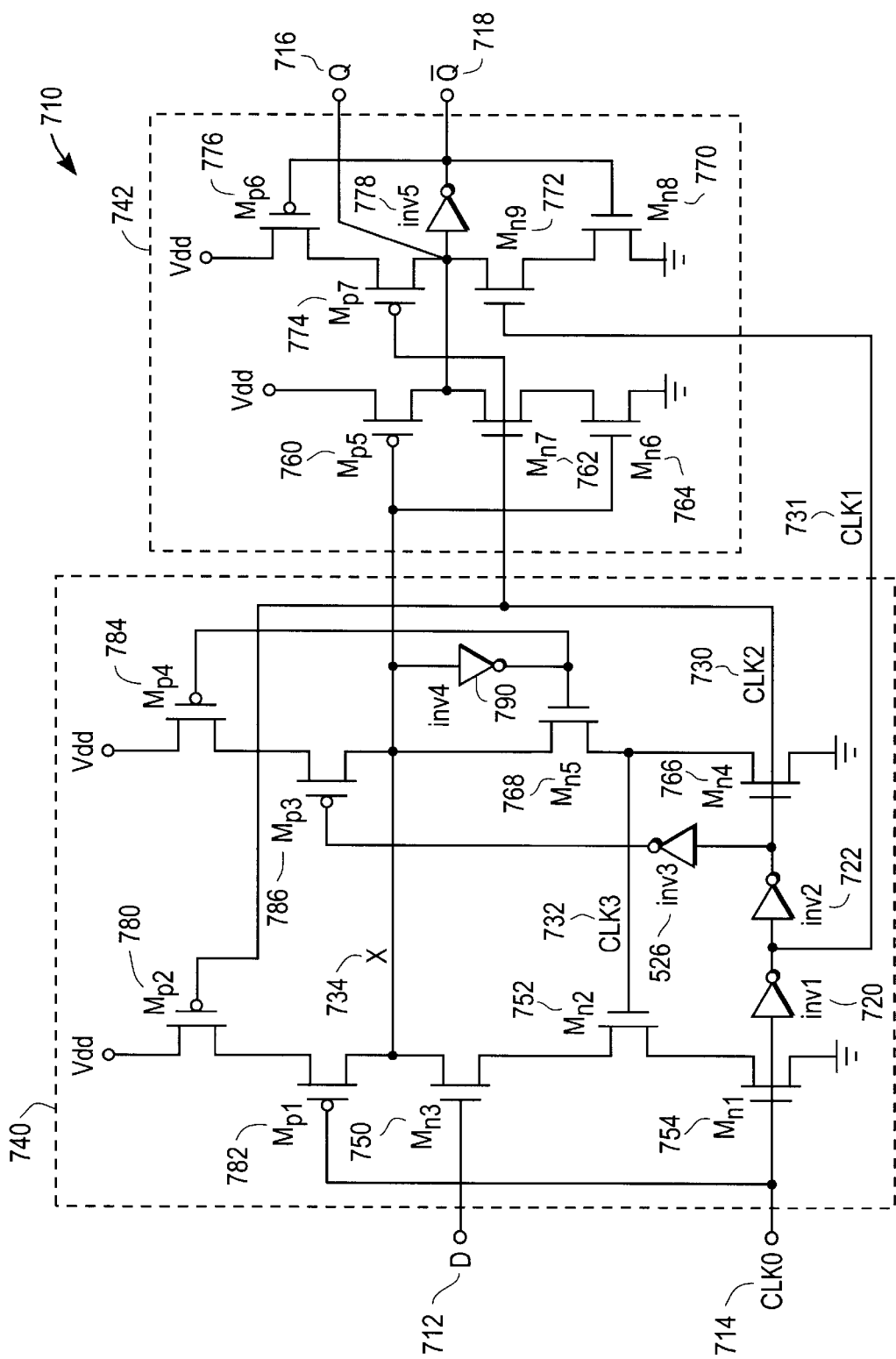
FIG. 5 is a schematic circuit diagram of a second embodiment of the present invention.

FIG. 5 is a schematic circuit diagram of one embodiment of the present invention. The D type flip-flop 710 has two functional stages: the first or pre-charge stage 740 and the second or evaluation stage 742. The first stage 740 produces a signal at internal node X 734, and the second stage 742 produces the outputs Q 716 and Qbar 718. The first stage 740 is pre-charged (set to the default high logic level(H)) when the input clock CLK0 714 is at the low logic level(L). The first stage 740 allows a closed circuit path (Mn3 750, Mn2 752 and Mn1 754) from node X 734 to ground in the transparency window (i.e., when CLK0=CLK3=H), if the data input D 712 is H. This turns transistor Mp5 760 on and sets the output Q 716 to H. Once the internal node X 734 is pulled to L, transistors Mn4 766 and Mn5 768 keep node X 734 at L for the duration of the high logic level(H) of the delayed clock CLK2 730.

If the input D 712 is L in the transparency window, node X 734 remains at H. The H on node X 734 is kept (restored) after the transparency window, when CLK3 730 goes to L. The H on node X 734, after the rising edge of the delayed clock CLK2 730 causes the output Q 716 to be pulled to L (transistors Mn6 764 and Mn7 762 are on). During the time the input clock CLK0 714 is at L, and when the forward path (transistors Mn6 764, Mn7 762, Mp5 760) is off, the output Q 716 is kept at its logic level by the conditional keeper (transistors Mn8 770, Mn9 772, Mp7 774, Mp6 776 and inverter inv5 778).

The SDFF glitch occurrence (462 in FIG. 2) is prevented by delaying the reset of the output Q 716, i.e., the output Q 716 is connected to ground when the delayed clock CLK2 730 goes to H. This allows the node X 734 to evaluate to L, when input D 712 is H, before node X's transient high level is used to reset the output Q 716. However, this solution may create another potential hazard. When the clock CLK0 714 transitions from H to L, a fast pre-charge of node X 734 (assuming transistor Mp2 780 is absent and Mp1 782 is connected directly to node X 734) and slow propagation of the low logic level of the clock through the inverters inv1 720 and inv2 722 would cause the overlap between the node X 734 at H and CLK2 730 at H. As a result, the transistors Mn7 762 and Mn6 764 would turn on, and another glitch, or even a false switching of the node Q could potentially occur. This is avoided by the delayed pre-charge of the node X 734 via transistors Mp2 780 and Mn4 766. The transistor Mp2 780 inhibits the pre-charge of the first stage 740 before the falling edge of the delayed clock CLK2 730. The role of the transistor Mn4 766 is to additionally ensure the low level of the node X 734 when CLK2 730 is at H. Without the transistor Mn4 766, there would be no path from the node X 734 to ground in the timing window between falling edges of input clock CLK0 714 and delayed clock CLK2 730. Therefore, the node X 734 would remain at L (preventing the false switching of the flip-flop), but it would be more sensitive to noise in the flip-flop environment. Since the size of the transistor Mn4 766 is minimal, it adds additional robustness to the design with minimal performance penalty.

In sum, the embodiment of FIG. 5 shows both a delayed reset of the output Q and a delayed pre-charge of the first stage. The delayed reset is achieved by controlling the forward path from Q to the ground and by delaying the clock signal (CLK2). This leaves time for the internal node X to transition to the low level after the rising edge of the clock CLK0. The output Q is disabled until the correct value of node X is set. Consequently, the glitch that appears at Q in case of SDFF, when the H to L transition is controlled by input clock CLK0, is prevented.

This delayed reset causes the need for a delayed pre-charge of the first stage, since the second stage forward path to the ground remains open until the delayed clock (CLK2) is pulled to L. Therefore, the pre-charge of internal node X should not start before CLK2 goes to L. This is achieved by the pre-charge pMOS transistors Mp1 and Mp2 and the keeping nMOS transistor Mn5, that provides keeping node X at L after the falling edge of clock CLK0 and before the falling edge of delayed clock CLK2.

In FIG. 5 the conditional keeper of node X keeps or maintains the low level of node X, when CLK2 is H, and keeps the high level of node X, when CLK3 is L. The conditional keeper of output Q keeps the low level of output Q, when CLK1 is H, and keeps the high level of output Q, when CLK2 is L. Each conditional keeper is off during some or all of the transparency window in order to allow node X or output Q to change without fighting their respective keepers. In one embodiment, the conditional keeper of node X is off during a beginning portion of the transparency window and the conditional keeper of output Q is off during an ending portion of the transparency window, where the beginning and ending portions may overlap either partially or fully.

Table 1 below shows the SPICE simulation results of the embodiment of FIG. 5 with the conditional keepers and the removal of the glitch, as normalized to the conventional SDFF. The input data activity is 50%.

TABLE 1

|  | Delay (psec) | Clock Power (µW) | Data Power (µW) | Total Power (µW) | EDP |
|---|---|---|---|---|---|
| SDFF | 1.00 | 1.00 | 1.00 | 1.00 | 1.00 |
| FIG. 5 | 1.08 | 0.81 | 0.45 | 0.68 | 0.81 |

The EDP is the Energy Delay Product. The EDP is a figure of merit and in this case is the total power dissipated ($P_{diss}$) times the delay ($t_d$) divided by the clock frequency ($f_{CLK0}$), e.g., 500 MHz. The delay includes the flip-flop setup time+ clock-to-output time. The un-normalized EDP formula is thus:

$$EDP = \frac{t_d \times P_{diss}}{f_{CLK0}}$$

As Table 1 illustrates the embodiment of FIG. 5 has substantially the same delay as the SDFF, but consumes significantly less power.

In another embodiment, the delayed reset/pre-charge technique described above may be used together with transistor sizing to equalize the high-to-low and/or low-to-high delay for the optimum set-up times.

Figure 6:
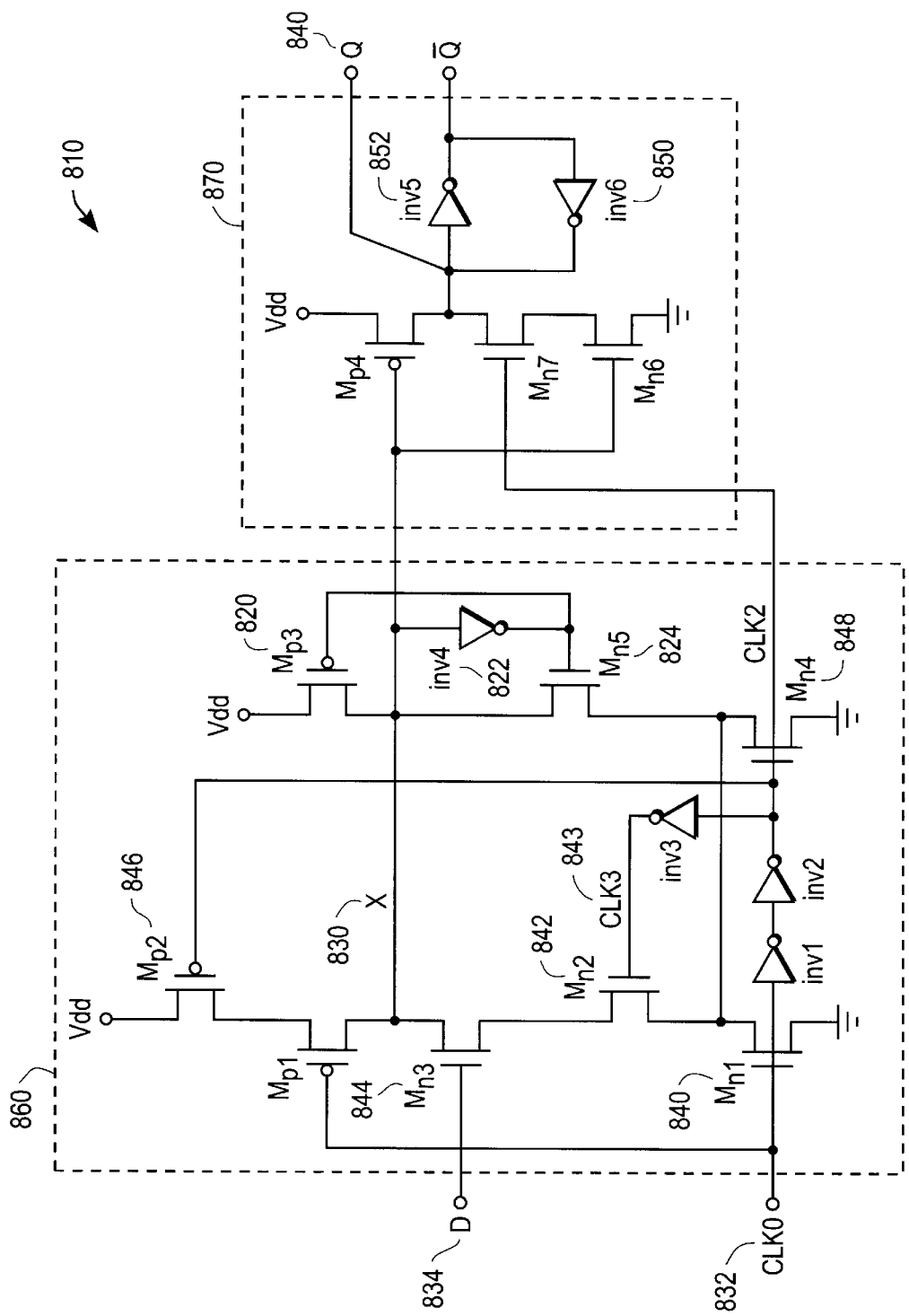
FIG. 6 is a schematic circuit diagram of a third embodiment of the present invention with an unconditional (i.e., conventional) keeper at the output.

FIG. 6 is a schematic circuit diagram of a second embodiment of the present invention with an unconditional (i.e., conventional) keeper at the output. The embodiment uses the delayed reset technique to avoid the glitch at the output Q. A partially conditional keeper in the first stage 860, that includes transistors Mp3 820 and Mn5 824 and inverter inv4 822, is used. Node X 830 keeps a high logic level unconditionally, and keeps a low logic level only if the input clock CLK0 832 is H, i.e., the slow pre-charge operation is performed without the contention with the keeper. The evaluation path of the node X 830 (transistors Mn1 840, Mn2 842, and Mn3 844) has to overpower the high-level keeper (transistor Mp3 820), i.e., the nMOS transistors need to pull enough current to switch node X 830 to L. While this may slow down the transition of node X and increase power consumption of the flip-flop, it may improve noise immunity of the flip-flop. The size of the transistor Mp3 820 can be used to tradeoff the noise immunity for the performance of the flip-flop, when needed.

Figure 7:
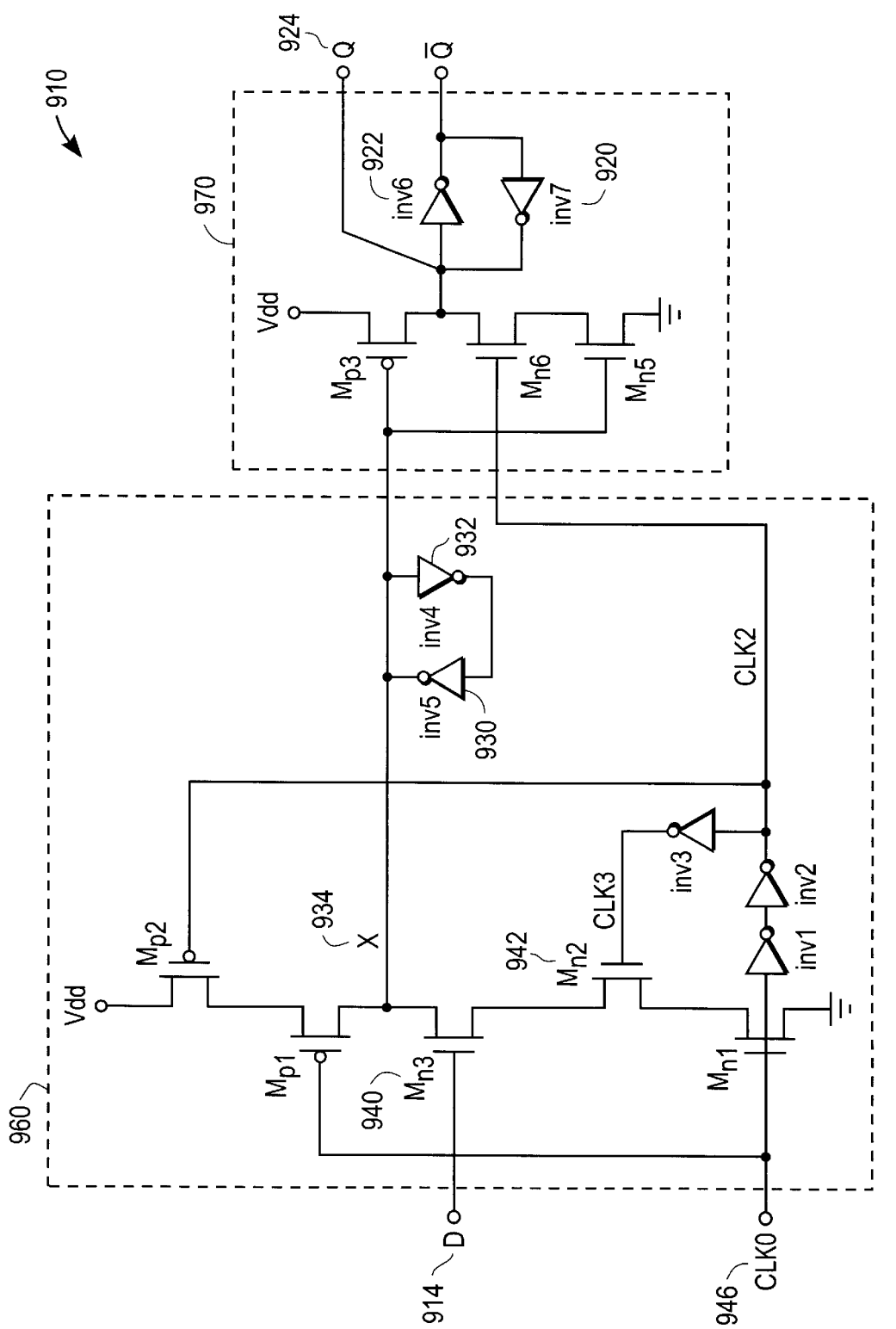
FIG. 7 is a schematic circuit diagram of a fourth embodiment of the present invention with an unconditional (i.e., conventional) keeper at both the internal node X and at the output Q.

The second stage 870 of the flip-flop 810 is made fully static with an unconditional keeper (inv6 850 and inv5 852). The delayed pre-charge of node X 830 is accomplished via the transistors Mp2 846 and Mn4 848 similar to the embodiment of FIG. 7 is a schematic circuit diagram of a third embodiment of the present invention with an unconditional (i.e., conventional) keeper at both the internal node X and at the output Q. FIG. 7 is similar to FIG. 6 where the second stage 970 is the same as or similar to the second stage 870 of FIG. 6. The first stage 960 has an unconditional (conventional) keeper (back-to-back inverters, inv5 930 and inv4 932) in place of the partially conditional keeper in the first stage 860 of FIG. 6. The operation of FIG. 7 is similar to that of FIG. 6.

Figure 8:
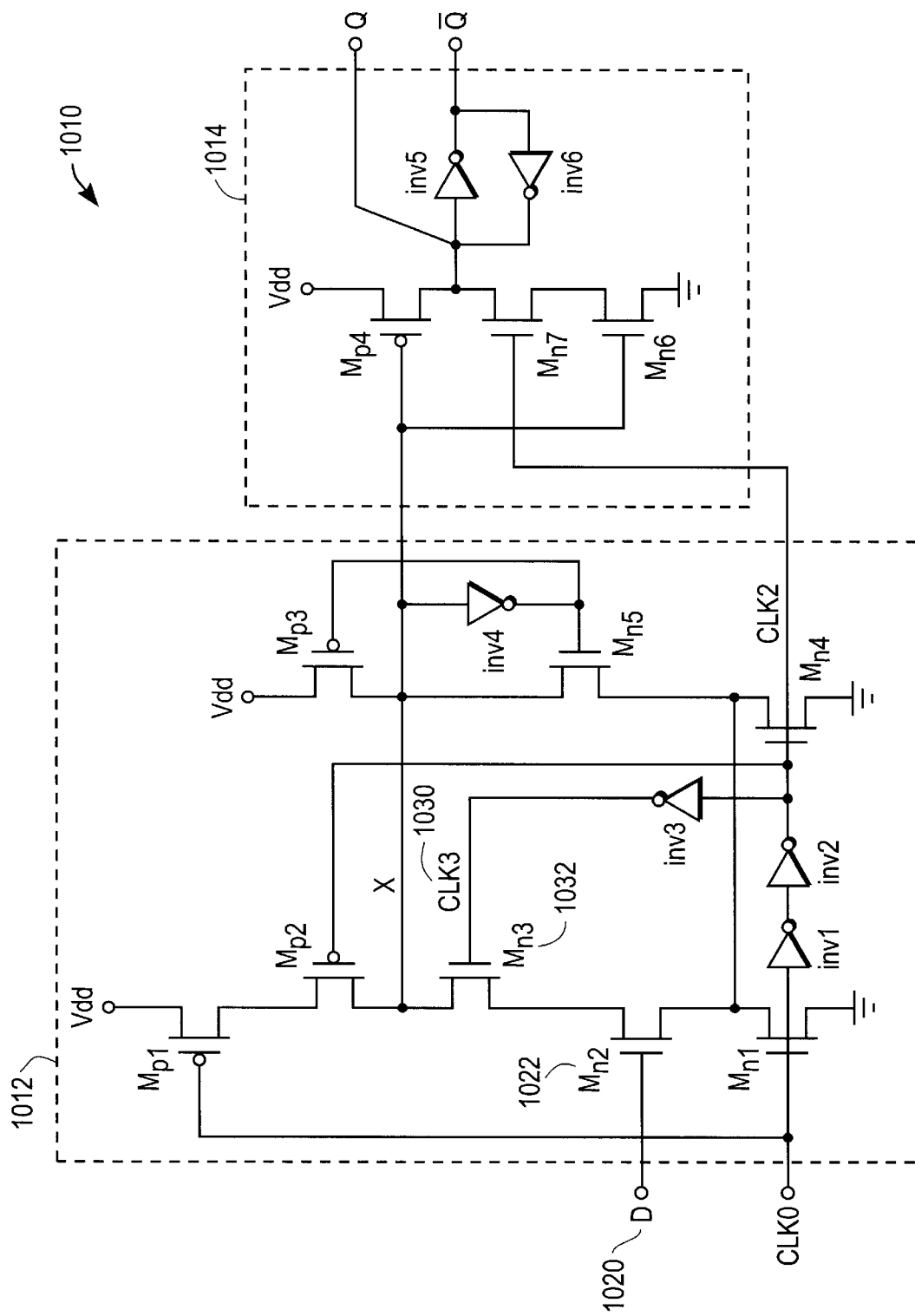
FIG. 8 is a schematic circuit diagram of a fifth embodiment of the present invention with an unconditional (i.e., conventional) keeper at the output.

FIG. 8 is a schematic circuit diagram of a fourth embodiment of the present invention with an unconditional (i.e., conventional) keeper at the output. FIG. 8 is similar to FIG. 6, except the transistors Mn2 1022 (for input D 1020) and Mn3 1032 (for clock CLK3 1030) have been switched (In FIG. 6 Mn2 842 for CLK3 843 is below Mn3 844 for input D 834). The embodiment of FIG. 6 with the input D 834 at the top of the first stage 860 nMOS transistor stack minimizes the data-to-output time at the optimum set-up time. The flip-flops in FIGS. 6 and 8 may have negative optimum set-up times. Thus while FIG. 8 illustrates another embodiment of the present invention, the use of the embodiment of FIG. 6 is preferred.

Figure 9:
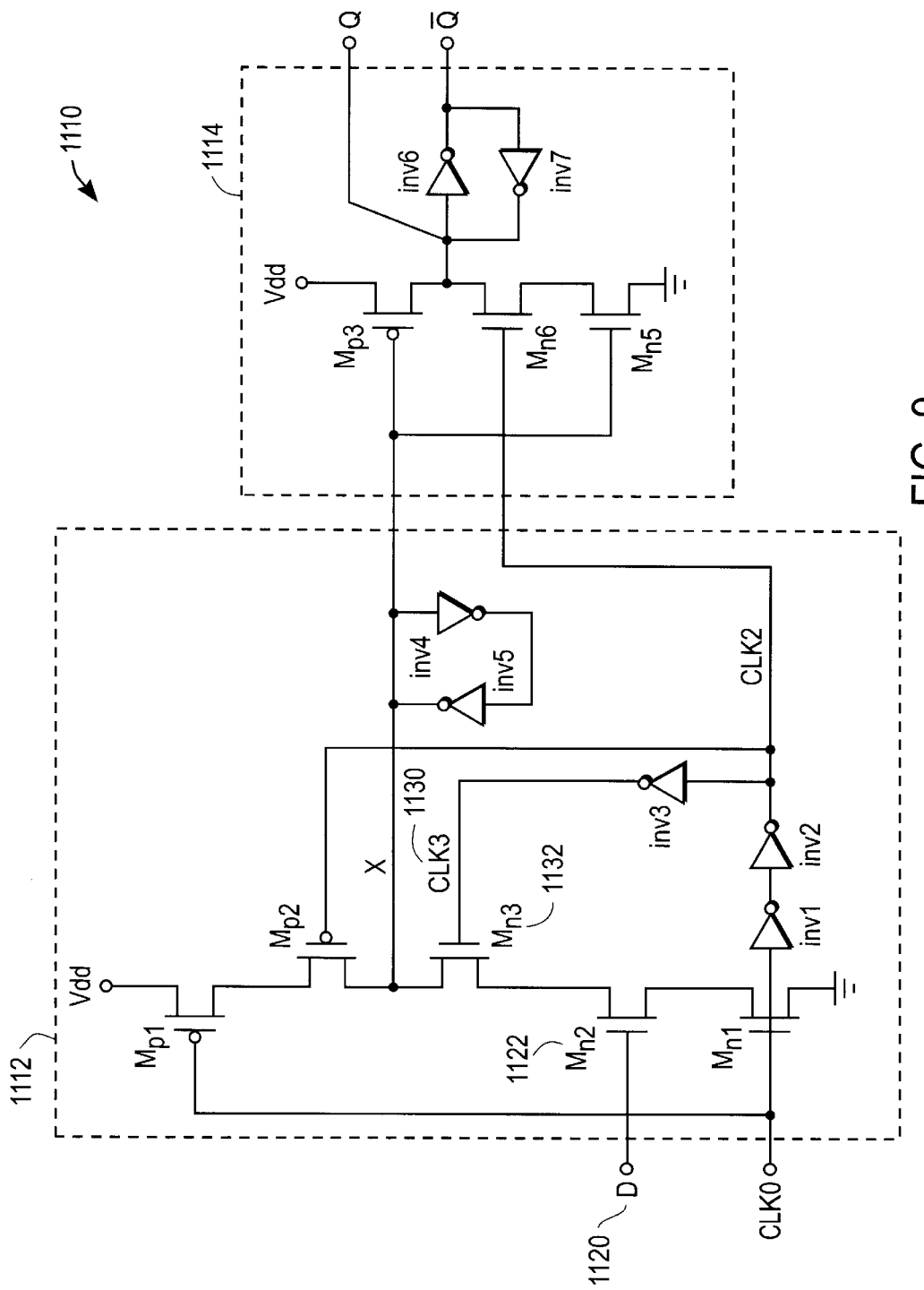
FIG. 9 is a schematic circuit diagram of a sixth embodiment of the present invention with an unconditional (i.e., conventional) keeper at both internal node X and at the output Q.

FIG. 9 is a schematic circuit diagram of a fifth embodiment of the present invention with an unconditional (i.e., conventional) keeper at both internal node X and at the output Q. FIG. 9 is similar to FIG. 7, except the transistors Mn2 1122 (for input D 1120) and Mn3 1132 (for clock CLK3 1130) have been switched (In FIG. 7 Mn2 942 is below Mn3 940 in the input nMOS stack). The embodiment of FIG. 7 with the input D 944 at the top of the first stage 960 nMOS transistor stack minimizes the data-to-output time at the optimum set-up time. The flip-flops in FIGS. 7 and 9 may have negative optimum set-up times. Thus while FIG. 9 illustrates another embodiment of the present invention, the use of the embodiment of FIG. 7 is preferred.

Figure 10:
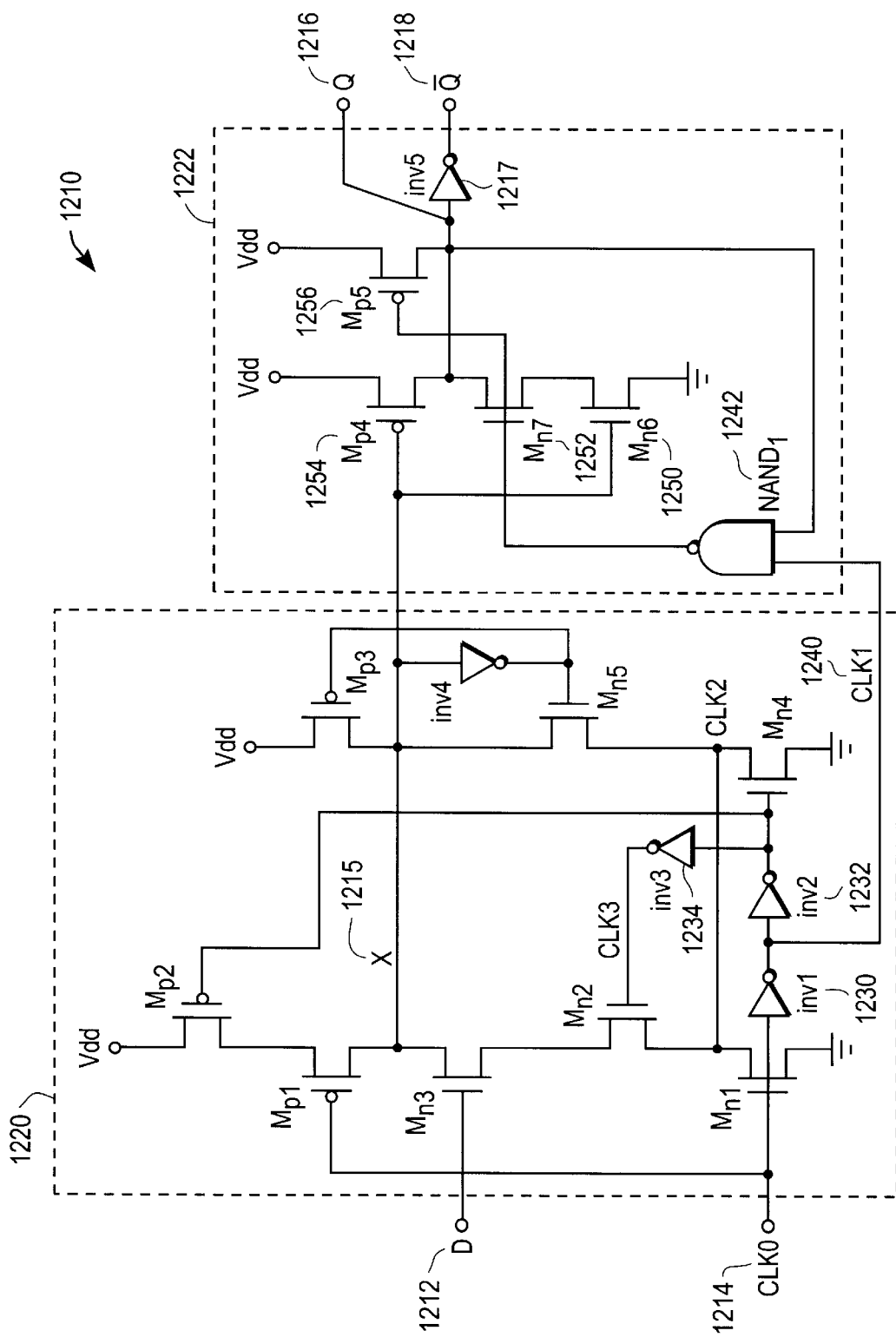
FIG. 10 is a schematic circuit diagram of another embodiment of the present invention with the keeping function of the second stage performed by a feedback NAND gate.

FIG. 10 is a schematic circuit diagram of another embodiment of the present invention with the keeping function of the second stage performed by a feedback NAND gate. The first stage 1220 is similar to and has the function of first stage 860 in FIG. 6. Node X 1215 and clock CLK1 1240 (clock CLK0 1214 inverted and delayed through inverter inv1 1230) are outputted from the first stage 1220 and inputted into the second stage 1222. The second stage 1222 has the delayed reset function of CLK2 (the clock reference signal seen by the second stage is delayed through the inverter inv1 and the NAND gate NAND1 1242). When output Q 1216 is H, then NAND1 1242 functions as an inverter for CLK1 1240 and the NAND output 1243 is CLK2. When output Q 1216 is L, NAND output 1243 is H, transistor Mn7 1252 is on, and output Q 1216 gets the inverted value of node X 1215 via transistors Mn6 1250 and Mp4 1254.

The embodiment of FIG. 10 provides delay improvements. These delay improvements are from reducing the complexity of the layout of the critical path, so that the parasitic drain diffusions and contact capacitances in the critical path are minimized.

The sizing of the transistors Mn6 1250, Mn7 1252, Mp4 1254, and Mp5 1256 in FIG. 10 can be used to improve the driving capability of the output Q, compared to the conventional flip-flop. This sizing allows the flip-flop 1210 of FIG. 10 to drive large loads even when noise spikes occur, because the strong NAND gate NAND1 1242 is much less sensitive to noise compared to the weak keeper of the second stage of the conventional flip-flop, e.g., FIG. 1 inv5 318 and inv6 319. In a noisy environment, the typical component following the flip-flop that needs the output of the conventional flip-flop, e.g., FIG. 1, uses Qbar 317 and inverts it again, rather than using Q 316. Qbar 317 is used in order to prevent noise from being injected back into output Q 316, overpowering the weak keeper, and undesirably switching the output Q 316. However, this incurs an additional delay of two inverters, over using Q directly or only one inverter, if the consumer, is willing to use Qbar instead of Q. The use of the NAND gate NAND1 1242 in FIG. 10 allows for output Q 1216 to be used directly.

Figure 11:
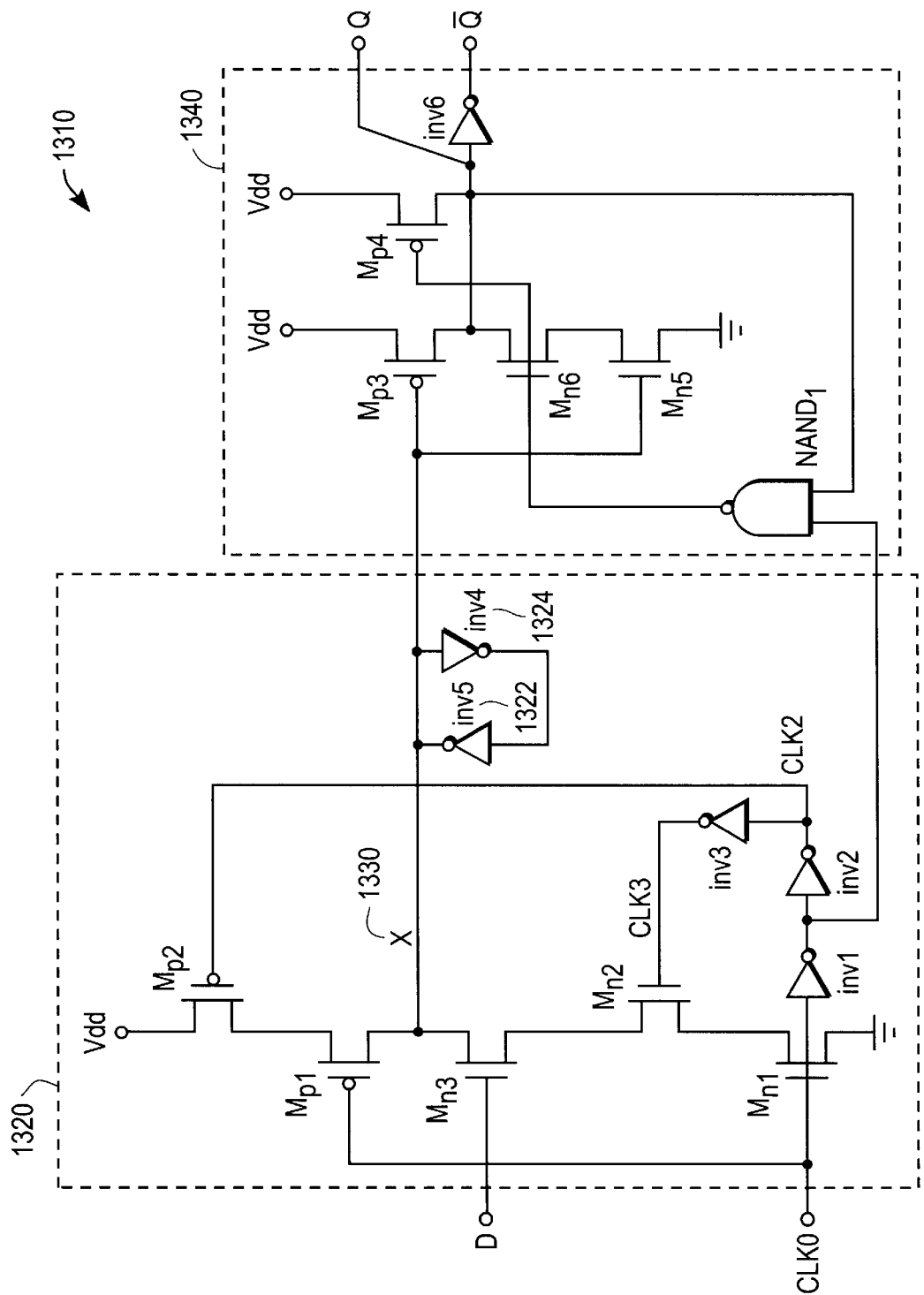
FIG. 11 is a schematic circuit diagram of yet another embodiment of the present invention with the keeping function of the second stage performed by a feedback NAND gate and an unconditional keeper in the first stage.

FIG. 11 is a schematic circuit diagram of yet another embodiment of the present invention with the keeping function of the second stage performed by a feedback NAND gate and an unconditional keeper in the first stage. FIG. 11 has the same second stage 1340 as the second stage 1222 of FIG. 10. The first stage 1320 is similar to the first stage 1220 of FIG. 10, except the conditional keeper in the first stage 1220 of FIG. 10 has been replaced by an unconditional keeper, i.e., back-to-back inverters inv4 1324 and inv5 1322.

From looking at the second stages of FIGS. 10 and 11 above, it can be seen that other digital logic may be embedded in the second stage of the flip-flop. For example, in the second stage 1222 of FIG. 10, the transistors Mn6 1250, Mn7 1252, Mp4 1254, and Mp5 1256 form a static CMOS NAND gate with two inputs node X 1215 and the output 1243 of NAND1 1242, and one output, output Q 1216. It is easier to embed an additional digital logic circuit directly into the second stage 1222 of FIG. 10 using its static CMOS NAND gate, rather than waiting for the output Q 1216 of the second stage 1222 to be evaluated first, and then using the output Q 1216 in the additional digital logic circuit.

Figure 1:
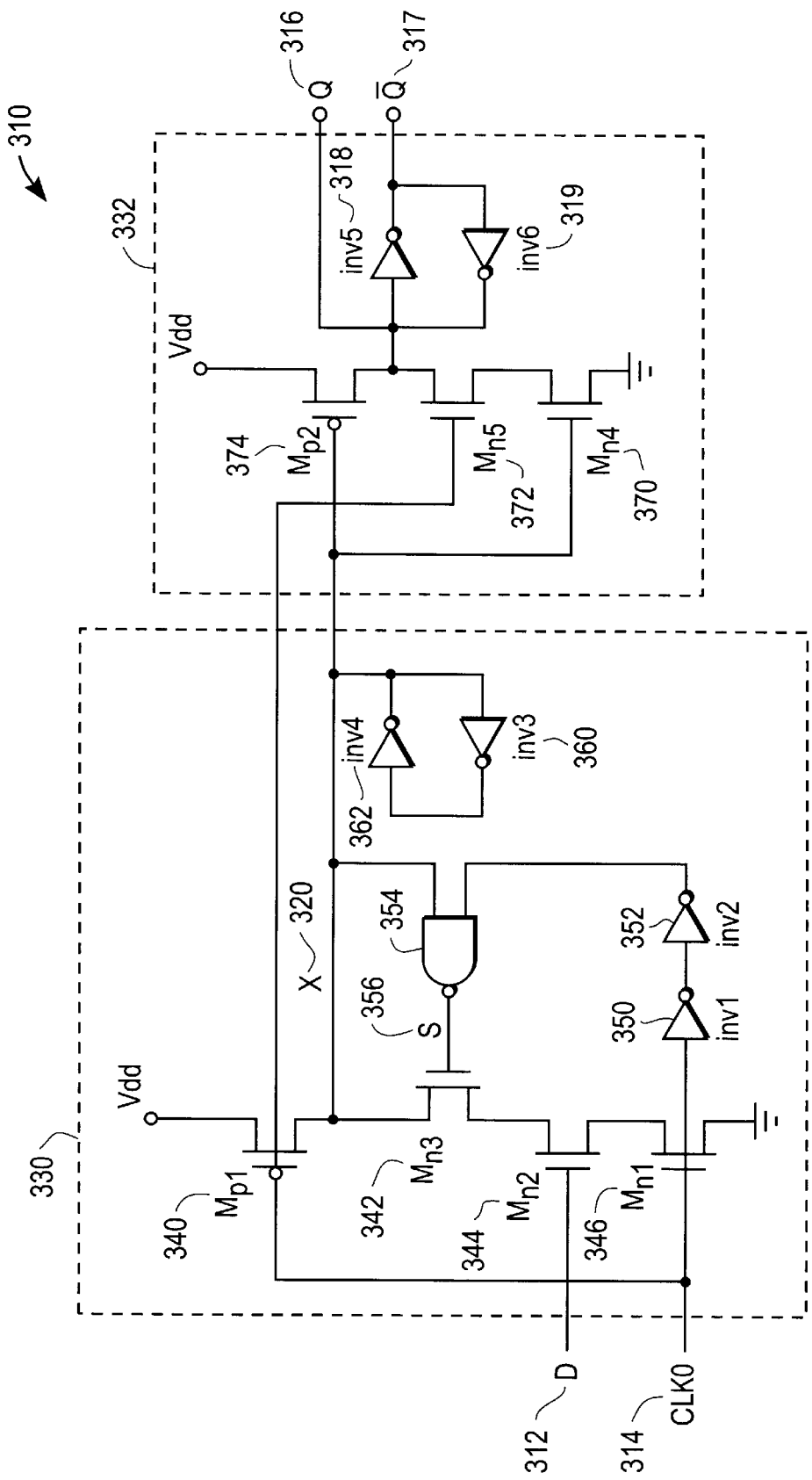
FIG. 1 shows a schematic circuit diagram of a typical prior art SDFF.
Figure 2:
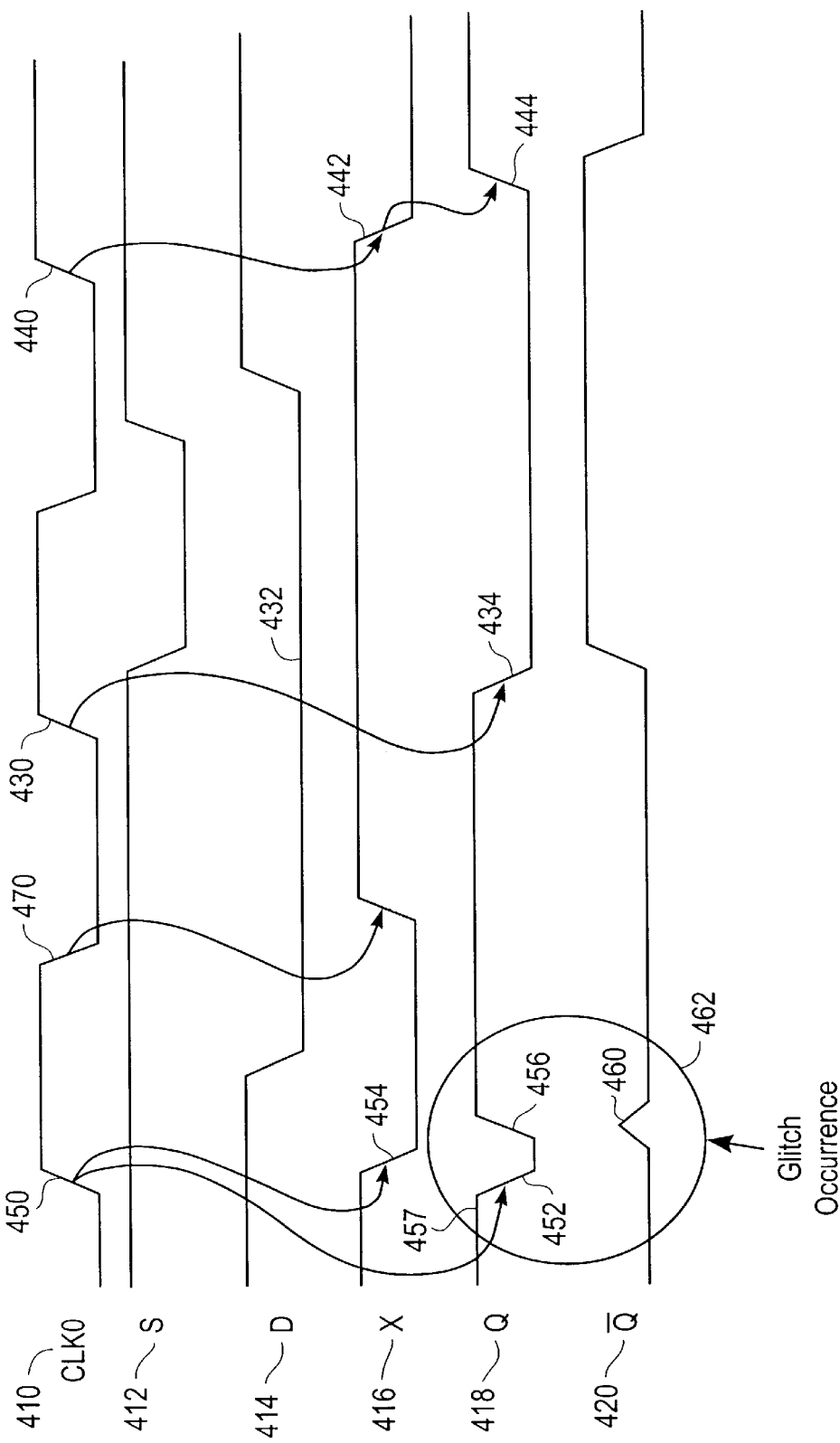
FIG. 2 is an example timing diagram for the SDFF schematic circuit diagram of FIG. 1 showing a glitch in the output.
Figures 2, 12:
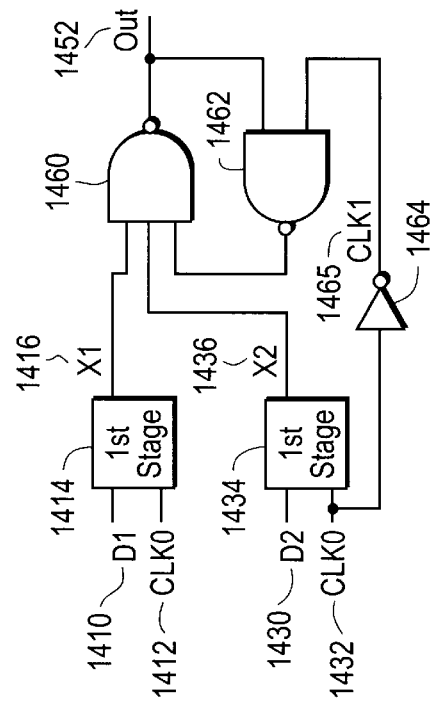
Figures 4, 12:
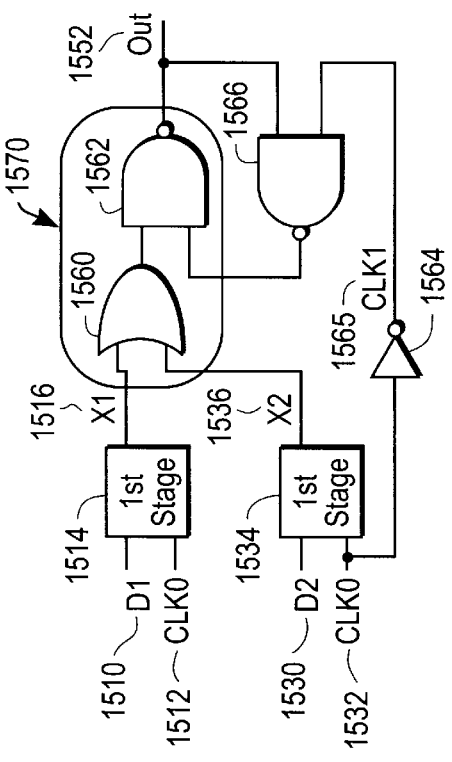
Figures 1, 12:
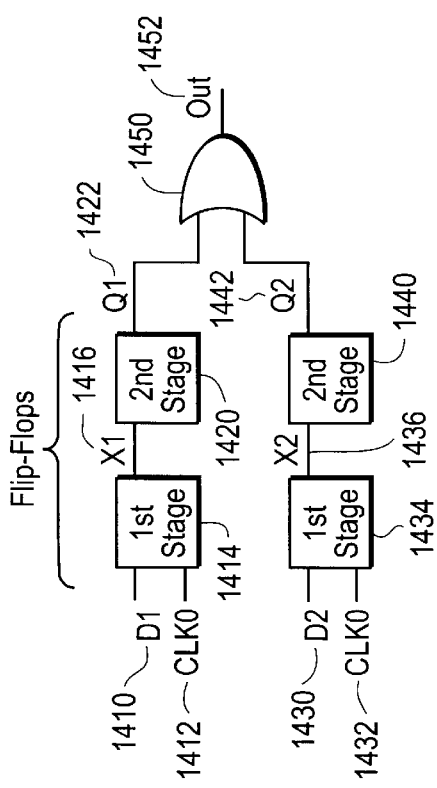
Figures 3, 12:
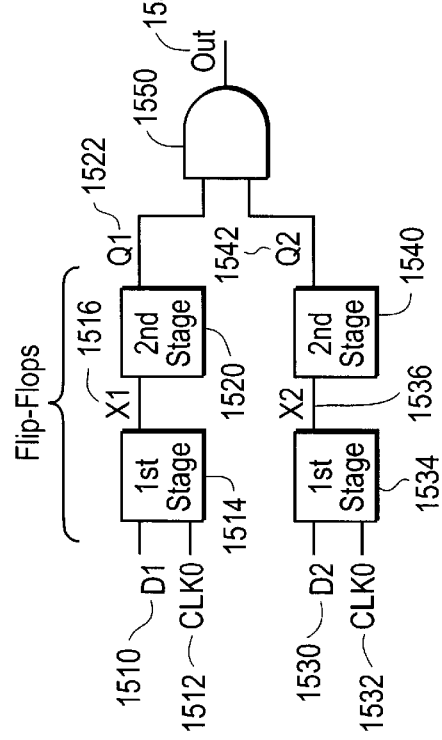

FIGS. 12-1, 12-2, 12-3 and 12-4 show examples of the second stages of two flip-flops being combined. For example, the circuits in FIGS. 12-2 and FIGS. 12-4 show the equivalent of the circuits shown in FIGS. 12-1 and FIGS. 12-3, respectively.

FIGS. 12-1 has two D-type flip-flops. The first flip-flop has inputs D1 1410 and CLK0 1412 into the first stage 1414, an internal node X1 1416 that connects the first stage 1414 to the second stage 1420, and output Q1 1422. The second flip-flop has inputs D2 1430 and CLK0 1432 into the first stage 1434, an internal node X2 1436 that connects the first stage 1434 to the second stage 1440, and output Q2 1442. The outputs Q1 1422 and Q2 1442 are combined in an OR gate 1450 to give output 1452.

FIGS. 12-2 has the logical equivalent circuit of FIGS. 12-1 with the two second stages 1420 and 1440, and the OR gate 1450 combined. The outputs X1 1416 and X2 1436 of the two first stages (1414 and 1434) are input along with the output of a feedback NAND gate 1462 (similar to NAND1 1242 of FIG. 10) into a three input NAND gate 1460. The output of the NAND gate 1460 is the combined circuit output OUT 1452 and is inputted into feedback NAND gate 1462, which also receives CLK1 1465, i.e., CLK0 1432 through inverter 1464.

FIGS. 12-3 has two D type flip-flops. The first flip-flop has inputs D1 1510 and CLK0 1512 into the first stage 1514, an internal node X1 1516 that connects the first stage 1514 to the second stage 1520, and output Q1 1522. The second flip-flop has inputs D2 1530 and CLK0 1532 into the first stage 1534, an internal node X2 1536 that connects the first stage 1534 to the second stage 1540, and output Q2 1542. The outputs Q1 1522 and Q2 1542 are combined in an AND gate 1550 to give output 1552.

FIGS. 12-4 has the logical equivalent circuit of FIGS. 12-3 with the two second stages 1520 and 1540, and the AND gate 1550 combined. The outputs X1 1516 and X2 1536 of the two first stages (1514 and 1536) are input into OR gate 1560. The output of OR gate 1560 is input along with the output of a feedback NAND gate 1566 (similar to NAND1 1242 of FIG. 10) are inputted into a two input NAND gate 1562. The OR gate 1560 and NAND gate 1562 form an Or-And-Invert logic (OAI) single stage circuit 1570. The output of the OAI 1570 is the combined circuit output OUT 1552 and is inputted into feedback NAND gate 1566, which also receives CLK1 1565, i.e., CLK0 1532 through inverter 1564.

When the additional digital logic function needs to be implemented anyway, the effective delay of the flip-flop becomes the difference between the delay of the flip-flop with additional logic embedded and the delay of the additional digital logic circuit alone. Thus the circuitry is embedded with minimal, if any, delay penalty. This embedding when done together with logic embedding in the first stage of the flip-flop, allows the entire flip-flop delay overhead to be masked.

Although specific embodiments of the invention have been described, various modifications, alterations, alternative constructions, and equivalents are also encompassed within the scope of the invention. While a transparency window of three inverters is given in some embodiments in this disclosure, the transparency window is not so limited. In an alternative embodiment there may be one or more inverters. More specifically there may be an odd number of inverters. The transparency window in other embodiments of the present invention may include any time duration in which both the pre-charge or first stage and the evaluation or second stage are active. For example, the transparency window in FIG. 4 is when both CLK0 612 and CLK3 668 are H, but other activation schemes as determined by one of ordinary skill in the arts may be used and are within the scope of this invention. In addition while the disclosed embodiments show a D-type flip-flop, the scope of this invention includes other flip-flops, latches, and memory circuits in which there is a first or pre-charge stage and an evaluation or second stage coupled together by at least one internal node, where this internal node is charged or discharged.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A method for reducing hazards in a flip-flop, comprising, a pro-charged stage coupled to an evaluation stage by at least an internal node, said method comprising the steps of:

said pro-charged stage charging said internal node, and thereafter setting said internal node based on a data input in response to a transition in a clock signal;

preventing said evaluation stage from evaluating said internal node for a predetermined time period after the transition in the clock signal, said preventing step comprising the step of delaying the turn on of a transistor in the evaluation stage during the predetermined time period; and after said predetermined time period, evaluating said internal node by said evaluation stage to determine an output of said flip-flop.

2. The method of claim 1 wherein said flip-flop is of a hybrid type.

3. The method of claim 1 wherein said flip-flop is a D type flip-flop.

4. The method of claim 1 further comprising:

when said internal node has a low logic level, delaying restoring said internal node to a high logic value until a next time that said evaluation stage is prevented from evaluating said internal node.

5. The method of claim 1 further comprising disabling an internal node keeper during said pre-charged stage setting said internal node based on a data input.

6. The method of claim 1 wherein said preventing said evaluation stage from evaluating said internal node includes setting said output to a low logic level.

7. The method of claim 1 further comprising disabling an output keeper during said evaluating said internal node by said evaluation stage.

8. A system for reducing hazards in a hybrid flip-flop comprising:

a pre-charge stage for charging a pre-charge stage output and thereafter setting the pre-charge stage output depending upon a data input during a transparency window; and an evaluation stage for evaluating said pre-charge stage output to produce a data output during said transparency window, wherein said evaluation stage is enabled to change said data output to a low logic level only after a predetermined time period from the beginning of the transparency window, wherein said pre-charge stage sets said pre-charge stage output during said predetermined time period, and wherein the evaluation stage is enabled to change said data output to a low logic level by at least the turning on of a transistor in the evaluation state at the end of the predetermined time period.

9. The system of claim 8 wherein said transparency window comprises a time period when said pre-charge stage output is logically equivalent to an inverted value of said data input.

10. The system of claim 8 wherein after said transparency window, said pre-charge stage output is restored to a default logic level, when said evaluation stage is disabled to change said data output to a low logic level.

11. The system of claim 8 further comprising a conditional keeper connected to said pre-charge stage output, said conditional keeper including a keeper that is disabled when said pre-charge stage determines said pre-charge stage output.

12. The system of claim 8 further comprising a conditional keeper connected to said data output, said conditional keeper including a keeper that is disabled when said evaluation stage evaluates said pre-charge stage output.

13. The system of claim 8 further comprising an unconditional keeper connected to said pre-charge stage output.

14. The system of claim 8 further comprising an unconditional keeper connected to said data output.

15. The system of claim 8 wherein said evaluation stage comprises a NAND gate for disabling said evaluation stage.

16. The system of claim 15 further comprising a plurality of pre-charge stages having pre-charge stage outputs, and wherein said evaluation stage comprises a digital logic circuit coupled to the pre-charge stage outputs.

17. The system of claim 15 wherein said pre-charge stage comprises an unconditional keeper coupled to said pre-charge stage output.

18. The system of claim 15 wherein said pre-charge stage comprises a conditional keeper coupled to said pre-charge stage output.

19. The system of claim 8 wherein said evaluation stage comprises a plurality of NAND gates.

20. The system of claim 19 wherein a NAND gate of said plurality of NAND gates is combined with a digital logic circuit connected to said hybrid flip-flop.

21. A system for reducing hazards in a hybrid flip-flop comprising:
    a pre-charge stage for charging a pro-charge stage output and thereafter setting the pro-charge stage output depending upon a data input during a transparency window; and
    an evaluation stage for evaluating said pro-charge stage output to produce a data output during said transparency window, wherein said evaluation stage is enabled to change said data output after a predetermined time period from the beginning of the transparency window, wherein said pro-charge stage sets said pro-charge stage output during said predetermined time period, and wherein the evaluation stage is enabled to change said data output by at least the turning on of a transistor in the evaluation state at the end of the predetermined time period.

22. The system of claim 21 wherein said transparency window comprises a time period when said pre-charge stage output is logically equivalent to an inverted data input.

23. The method of claim 22 further comprising:
    after said transparency window, disabling said evaluation stage; and
    pre-charging said pre-charge stage output to a default logic level.

24. A method for reducing hazards in a flip-flop, comprising, a pro-charged stage coupled to an evaluation stage by at least an internal node, said method comprising the steps of:
    charging the internal node and thereafter setting a first logic level for the internal node based on a data input to said pre-charged stage within a first section of a transparency window;
    disabling, for a predetermined time period from the beginning of the transparency window, said evaluation stage from setting a data output to a second logic level during said first section of said transparency window, said disabling step comprising the step of delaying the turn on of a transistor in the evaluation stage during the predetermined time period; and
    determining said data output during a second section of said transparency window based on said first logic level, wherein said second section follows said first section.

25. The method of claim 24 wherein said input comprises a high logic level, and wherein said determining said first logic level comprises setting said internal node to a low logic level.

26. The method of claim 24 further comprising:
    after said transparency window, disabling said evaluation stage again; and
    pre-charging said internal node to a default logic level.

27. A method for reducing power consumption in a hybrid flip-flop, comprising, a pro-charged stage coupled to an evaluation stage by at least an internal node, said method comprising the steps of:
    pre-charging the internal node;
    setting an input of said pro-charged stage to a first high logic level, wherein an output of said evaluation stage has a second high logic level;
    responsive to said setting said input, setting said pre-charged internal node to a low logic level within a beginning part of a transparency window;
    disabling, for a predetermined time period during said beginning part of said transparency window, said evaluation stage from setting said output to a low logic level, said disabling step comprising the step of delaying the turn on of a transistor in the evaluation stage during the predetermined time period; and
    said evaluation stage maintaining said second high logic level on said output during a remainder of said transparency window, using said low logic level of said internal node.

28. The method of claim 27 further comprising:
    after said transparency window, disabling said evaluation stage again; and
    charging said internal node to a third high logic level.

29. A system for reducing hazards in a hybrid flip-flop comprising:
    a pre-charge stage for charging a pre-charge stage output and thereafter setting the pre-charge stage output depending upon a data input during a first part of a transparency window, said pre-charge stage comprising a first conditional keeper for keeping said pre-charge stage output; and
    an evaluation stage for evaluating said pre-charge stage output, after a predetermined time period from the beginning of the transparency window, to produce a data output during a second part of said transparency window, wherein the evaluation stage is enabled to evaluate said pre-charge stage output by at least the turning on of a transistor in the evaluation state at the end of the predetermined time period, said evaluation stage comprising a second conditional keeper for keeping said data output.

30. The system of claim 29 further comprising:
    a clock signal;
    an inverted delayed clock signal, wherein said transparency window includes the time when said clock signal is at a first high logic level and when said inverted delayed clock signal is at a second high logic level; and
    a delayed clock signal for disabling said evaluation stage during said first part of said transparency window, wherein said disabling comprises preventing said evaluation stage from setting said data output to a first low logic level.

31. The system of claim 30 wherein said delayed clock signal delays pre-charging of said pre-charge stage until said delayed clock is at a second low logic level.

32. The system of claim 30 wherein said pre-charging includes setting said pre-charge stage output to a third high logic level.

33. The system of claim 30 wherein said inverted delayed clock signal is said clock signal delayed by an odd number of inverter circuits.

34. The system of claim 30 wherein said delayed clock signal is said clock signal delayed by an even number of inverter circuits.

35. A system for reducing hazards in a hybrid flip-flop comprising:
- a first means for charging a pre-charge stage output and thereafter setting the pre-charge stage output depending upon a data input during a first part of a transparency window, said pre-charge stage comprising a first conditional keeper means for keeping said pre-charge stage output; and
- a second means for evaluating said pre-charge stage output, after a predetermined time period from the beginning of the transparency window, to produce a data output during a second part of said transparency window, said second means being enabled to evaluate said pre-charge stage output by at least the turning on of a transistor of the second means at the end of the predetermined time period, and said second means comprising a second conditional keeper means for keeping said data output.

* * * * *